United States Patent
Ford et al.

(10) Patent No.: US 10,544,328 B2
(45) Date of Patent: Jan. 28, 2020

(54) PRINTED CIRCUIT BOARD INKS

(71) Applicant: SUN CHEMICAL CORPORATION, Parsippany, NJ (US)

(72) Inventors: Simon Richard Ford, Bath (GB); Stephen Anthony Hall, Wells (GB)

(73) Assignee: Sun Chemical Corporation, Parsippany, NJ (US)

( * ) Notice: Subject to any disclaimer, the term of this patent is extended or adjusted under 35 U.S.C. 154(b) by 24 days.

(21) Appl. No.: 15/743,518

(22) PCT Filed: Jul. 11, 2016

(86) PCT No.: PCT/US2016/041741
§ 371 (c)(1),
(2) Date: Jan. 10, 2018

(87) PCT Pub. No.: WO2017/014975
PCT Pub. Date: Jan. 26, 2017

(65) Prior Publication Data
US 2019/0023941 A1    Jan. 24, 2019

Related U.S. Application Data

(60) Provisional application No. 62/195,337, filed on Jul. 22, 2015.

(51) Int. Cl.
| | | |
|---|---|---|
| *C08F 2/46* | (2006.01) | |
| *C08F 2/50* | (2006.01) | |
| *C08G 61/04* | (2006.01) | |
| *C09D 179/08* | (2006.01) | |
| *C09D 11/101* | (2014.01) | |
| *C09D 11/102* | (2014.01) | |
| *H05K 3/28* | (2006.01) | |
| *C08G 73/14* | (2006.01) | |

(52) U.S. Cl.
CPC .......... *C09D 179/08* (2013.01); *C09D 11/101* (2013.01); *C09D 11/102* (2013.01); *H05K 3/287* (2013.01); *C08G 73/14* (2013.01)

(58) Field of Classification Search
CPC .... C09D 179/08; C09D 11/01; C09D 11/102; C08G 73/14; H05K 3/287

USPC .................................................. 522/1; 520/1
See application file for complete search history.

(56) References Cited

U.S. PATENT DOCUMENTS

| | | | | |
|---|---|---|---|---|
| 5,206,381 A | * | 4/1993 | Su .................. | C07D 209/48 548/476 |
| 2012/0028442 A1 | * | 2/2012 | Takamoto ............... | C09J 5/06 438/460 |
| 2012/0237778 A1 | * | 9/2012 | Mao ..................... | C09D 5/027 428/422 |
| 2016/0152773 A1 | * | 6/2016 | Murakami .......... | C08G 73/1035 522/170 |

FOREIGN PATENT DOCUMENTS

| | | | | |
|---|---|---|---|---|
| WO | WO 2008/155611 A1 | 12/2008 | | |
| WO | WO-2008155611 A1 | * 12/2008 | ........... | C09D 179/08 |
| WO | WO 2015/008744 A1 | 1/2015 | | |
| WO | WO-2015008744 A1 | * 1/2015 | ......... | C08G 73/1035 |

OTHER PUBLICATIONS

International Preliminary Report on Patentability issued in International Application No. PCT/US2016/041741/, dated Sep. 26, 2016.
International Search Report issued in International Application No. PCT/US2016/041741/, dated Sep. 26, 2016.
Written Opinion of the International Searching Authority issued in International Application No. PCT/US2016/041741/, dated Sep. 26, 2016.

* cited by examiner

*Primary Examiner* — Jessica Whiteley
(74) *Attorney, Agent, or Firm* — Charles C. Achkar; Ostrolenk Faber LLP.

(57) ABSTRACT

The present invention provides a photoimageable composition comprising a polyamideimide resin, an aprotic solvent, and one or more nitrogen containing ethylenically unsaturated monomers. By addition of the nitrogen containing ethylenically unsaturated monomer, UV curable acrylates can be added to the composition, and the composition is stable. The compositions of the present invention can produce high resolution images that are flexible, hard, and have excellent resistance.

16 Claims, No Drawings

PRINTED CIRCUIT BOARD INKS

CROSS REFERENCE TO RELATED APPLICATIONS

The present application is a § 371 National Phase application based on PCT/US2016/041741 filed Jul. 11, 2016, which claims the benefit of U.S. Provisional Application No. 62/195,337, filed Jul. 22, 2015 the subject matter of each of which is incorporated by reference in their entirety.

FIELD OF THE INVENTION

The present invention relates generally to hybrid thermally and energy curing polyamideimide or polyimide resin systems comprising nitrogen-containing ethylenically unsaturated monomers. The resin systems of the invention are compatible with UV curing acrylates. Stable hybrid UV-thermally curing polyamideimide or polyimide resin systems are thus produced.

BACKGROUND

There are a number of polyamideimide (PAI) and polyimide (PI) resins currently used in the electronic applications industry. These can be employed as protective coatings for high temperature applications or as insulating coatings for applications where good thermal shock or damp heat resistance is imperative. PAI and PI systems are also very flexible, which can be advantageous in thin film applications where substrates are often folded or flexed.

These PAI or PI coatings are generally thermally curing and do not have any UV sensitivity built into the formulation. Application of these coatings is therefore limited to direct imaging applications where the desired image is created directly onto the substrate, for example by screen printing.

There is a limit to what can be achieved in terms of image resolution using direct imaging techniques. Higher resolution images are usually achieved by using liquid photo-imageable (LPI) systems, where the resolution is determined by the phototool used to create the desired image. In order to create LPI coatings, formulations preferably encompass both thermally curing and UV curing elements.

There are several examples in the prior art of polyamideimide and polyimide polymers being modified to incorporate UV sensitivity to create photo-imageable resins, but these focus on grafting the UV functional groups onto the polymer backbone. This approach can lead to unstable materials with a short shelf-life, and the resultant polymers can be difficult to utilize in many electronic applications because of the complex processing requirements for subsequently printed inks.

Thermally curing polyamideimide and polyimide resins have limited compatibility in conventional ink formulations as they are nitrogen containing materials which are incompatible with typical unsaturated UV acrylates. When most UV acrylates are introduced to the PAI or PI resin systems, if they are not immediately incompatible, they tend to gel very quickly, making the composition unusable for practical applications.

The preparation of polyamide, polyimide, polyamideimide, and polybenzimidazoles is described in the art. See, for example, U.S. Pat. No. 8,269,358 which describes the use of bis(aminophenol) as a raw material for the preparation of polyamide and polyamideimide resins. The resins can be used as a photosensitive positive-type photo resist. U.S. Pat. No. 5,703,199 discloses a process for preparing polyamides, polyimides, and polybenzimidazoles.

U.S. Pat. No. 6,261,741 discloses a photosensitive heat resistant resin containing a polyamideimide (PAI) resin, an organic solvent for dissolving the PAI, an acrylic monomer or oligomer having at least two polymerizable double bonds, and a photoinitiator. The resin is used to make a heat resistant insulating film that can be patterned.

US 2013/009223 describe a multilayer film containing layers of polyamide and polyester. The films are prepared by co-extruding the different layers.

US 2004/0180286 disclose a photosensitive resin composition suitable as a material for a protective or insulating film of electronic components. The resins contain a polyamide or polyamideimide resin, and at least one photopolymerizable compound, selected from a silane coupling agent or a photopolymerizable unsaturated monomer having at least 5 photopolymerizable unsaturated bonds per molecule.

U.S. Pat. No. 8,871,422 disclose a negative-type photosensitive resin composition that can be used as a photoresist. The resin contains a component (A), which is a polymer having a terminal phenolic hydroxyl group, examples of which are polyimide, polyoxazole, polyamideimide, polyamide, polyamic acid, polyamic acid ester, and polyhydroxamide. The resin also contains a component (B), which is an acid-generating photoinitiator; and a component (C) which is a compound that can be crosslinked or polymerized by an action of the acid. The acid generator B generates acid by irradiation by UV light. The acid that is generated catalyzes the thermal reaction of the phenolic hydroxyl group on component A with component C, which contains a functional group that can react with A. Typical functionality would be a methylol group, which would react with A with the liberation of water. There is no free radical polymerization in this approach, and the formulation suffers from lack of resolution. Nitrogen containing ethylenically unsaturated monomers are not used.

KR 2006-0124859 provides a solder resist composition for printed circuit boards. The solder resist composition comprises a UV-reactive acrylic monomer, a photoinitiator, and an organic solvent. The composition further comprises a polyamideimide resin. The composition is dried to form a film, and the dried film is applied on the circuit board.

JP 2004-258544 discloses a retardation film that exhibits good durability against UV rays, and excellent transmittance for visible light. The film is prepared by mixing a UV absorbent into a polymer. The polymer can be, for example, polyamide, polyimide, polyester, polyether ketone, polyamideimide, polyesterimide, or the like.

JP 2012-077144 discloses a polyamideimide solution and a polyamideimide film that exhibit good heat resistance, solubility in an organic solvent, and a low line thermal expansion property. The polyamideimide resin can be applied to a variety of substrates, such as glass, metal, metal oxide, and single crystal silicon.

KR 2009-0062498 describes a molecular composite of polyamidimide and polyimides exhibiting heat resistance, high strength, low dielectric constant, good optical characteristics, and durability. The composite can be used as insulating coating materials of fibers, film, casting product, foam, adhesive, heat-resistant coating material, and wires.

KR 2012-0023545 provides a photo-sensitive resin composition, into which are mixed purine derivatives. The resin is at least one selected from polyamide acid, polyamide acid ester, polybenzoxazole, and polybenzthiazol. The resin can be used to form a cured relief pattern on a semi-conductor device.

JP 2008-260839 discloses a negative-type photosensitive resin composition comprising a polyamideimide. The composition is heat cured to form a film.

JP 4736863 discloses a positive photosensitive polyamideimide resin composition having good sensitivity, resolution, adhesion in development, and heat resistance. The composition comprises a polyamideimide, a compound which generates an acid under light, and a solvent.

JP 3823411 provides a photosensitive resin composition having good adhesiveness and wet heat resistance. The resin is obtained by incorporating at least either an epoxidized polyamide resin or an epoxidized polyamideimide resin and a photopolymerization initiator as essential ingredients in the composition.

There are many other industrial applications for which a photo-defined UV/thermal system would be advantageous. These include, but are not limited to, printed electronics, photovoltaic modules, semiconductors, automotive parts, aerospace, X-ray and 3D printing. Consequently, there is still a need in the art for a UV and thermally curing photo-defined system that is stable.

SUMMARY OF THE INVENTION

Polyamideimide systems have very good thermal properties due to the imide functionality and are able to withstand thermal cycling conditions as described. If these PAI systems could be made into liquid photo-imageable (LPI) systems, such as liquid photo-imageable solder masks (LPISMs), as described in the present application, they could be utilized in high temperature thermal cycling applications by providing high resolution, thermally stable solder masks with good storage stability.

In a particular aspect, the present invention provides a hybrid thermal and energy curable ink or coating composition comprising:
 a) one or more polyamideimide resins;
 b) one or more nitrogen containing ethylenically unsaturated monomers; and
 c) one or more aprotic solvents.

The one or more polyamideimide resins are generally present in an amount of about 2 wt % to about 35 wt %, based on the total weight of the ink or coating composition. The one or more nitrogen containing ethylenically unsaturated monomers are generally present in an amount of about 5 wt % to about 70 wt %; and the one or more aprotic solvents are generally present in an amount of about 5 wt % to about 60 wt %.

In certain embodiments, the ink or coating compositions of the invention may further comprise one or more amino acrylates, one or more epoxy acrylates, one or more non-nitrogen containing ethylenically unsaturated monomers, and/or one or more photoinitiators.

The ink and coating compositions of the invention are suitable for use in the fabrication of printed circuit boards, photovoltaic modules and devices, membrane switches, and printed electronics. The present invention also provides articles comprising the ink or coating compositions of the invention.

DETAILED DESCRIPTION OF THE INVENTION

It is to be understood that the foregoing general description and the following detailed description are exemplary and explanatory only, and are not restrictive of any subject matter claimed.

Unless otherwise defined, all technical and scientific terms used herein have the same meaning as is commonly understood by one of skill in the art to which the inventions belong. All patents, patent applications, published applications and publications, websites and other published materials referred to throughout the entire disclosure herein, unless noted otherwise, are incorporated by reference in their entirety for any purpose.

As described above, PAI and typical acrylates are generally incompatible in ink and coating compositions. The present invention is the first time that compositions can be prepared containing both PAI and acrylates that are stable. It has been found that nitrogen-containing ethylenically unsaturated monomers are compatible with PAI in ink and coating compositions. In addition, inclusion of nitrogen-containing ethylenically containing monomers in a composition containing PAI and typical acrylates improves the stability of the composition.

The method described in the present application allows UV acrylates to be introduced into polyamideimide or polyimide resin systems without the incompatibility issues mentioned above, creating a hybrid energy curing and thermal curing system. This system has the potential to be photo-defined due to the acrylate functionality, and also to be thermally crosslinked to increase the resistance of the ink to high temperature processes, such as, for example, lead-free soldering.

Prior art PAI based systems were only screen printable. The ink and coating compositions of the present invention are photoimageable, by increasing the compatibility and stability of the resin to UV acrylates. Photoimaging allows for greater image resolution and therefore intricate circuitry design to be achieved. The overall advantage of the present invention is the ability of the described PAI hybrid systems to be formulated into a stable ink composition, which, after application, can be photo-defined to produce high resolution images. Resultant films after final curing are tough, heat resistant, and flexible.

As the use of electronic devices for demanding applications increases, liquid photoimageable solder masks (LPISM) are expected to withstand a greater range of temperatures during accelerated aging tests, such as thermal cycling. Thermal cycling conditions specified by end users of the Printed Circuit Boards (PCBs) have increased in recent years from −40° C. to 125° C. (1000 cycles), to −40° C. to 150° C. (1000 cycles).

PAI systems have very good thermal properties due to the imide functionality, and are able to withstand thermal cycling conditions as described. If these PAI systems are made into LPISMs as described in the present application, they could be utilized in high temperature thermal cycling applications by providing high resolution, thermally stable solder masks with good storage stability.

The PAI systems of the present invention can be used as solder masks, as well as in other applications, including, but not limited to, printed electronics, photovoltaic modules, semiconductors, automotive parts, aerospace, X-ray and 3D printing.

In a particular aspect, the present invention provides a hybrid thermal and energy curable ink or coating composition comprising:
 a) one or more polyamideimide resins;
 b) one or more nitrogen containing ethylenically unsaturated monomers; and
 c) one or more aprotic solvents.

In certain embodiments, the ink or coating compositions of the invention may further comprise one or more amino acrylates, one or more epoxy acrylates, one or more non-nitrogen containing ethylenically unsaturated monomers, and/or one or more photoinitiators.

The ink and coating compositions of the invention are suitable for use in the fabrication of printed circuit boards, photovoltaic modules and devices, membrane switches, and printed electronics.

Screen defining is possible by closing certain areas of a mesh with emulsion. As an ink is squeezed over the mesh, only areas which are emulsion free will allow ink to flow onto the chosen substrate. When printing is complete, the desired image is visible on the panel. The resolution limits of screen printing arise from the line growth possible with wet ink once the screen is removed.

Photo-defining creates an image by a radiation source, as opposed to a screen. Art work covers a dry block of ink that is irradiated and cures the exposed film. The panel is then developed in chosen solvent to remove uncured/unexposed film, to reveal the image. The artwork dictates the level of resolution compared to an emulsion screen.

Soldermasks, as another example of a possible application of the photo-imageable PAI system, need to withstand soldering as a basic function. The ink or coating compositions used as soldermasks are assessed by measuring adhesion to the substrate after contact with solder.

Definitions

In this application, the use of the singular includes the plural unless specifically stated otherwise. As used herein, the singular forms "a," "an" and "the" are intended to include the plural forms as well, unless the context clearly indicates otherwise.

In this application, the use of "or" means "and/or" unless stated otherwise.

As used herein, the terms "comprises" and/or "comprising" specify the presence of the stated features, integers, steps, operations, elements, and/or components, but do not preclude the presence or addition of one or more other features, integers, steps, operations, elements, components, and/or groups thereof. Furthermore, to the extent that the terms "includes," "having," "has," "with," "composed," "comprised" or variants thereof are used in either the detailed description or the claims, such terms are intended to be inclusive in a manner similar to the term "comprising."

As used herein, the term "(meth)acrylate" refers to both acrylate and methacrylate compounds. When the term "acrylate" is used alone, it is understood that it encompasses both acrylate and methacrylate compounds.

As used herein, the term "article" or "articles" means a substrate or product of manufacture. Examples of articles include, but are not limited to: substrates such as paper, plastic, plastic or polymer film, glass, ceramic, or metal, and the like; and products of manufacture such as photovoltaic devices (e.g. solar panels), photovoltaic modules, membrane switches, or printed electronics, and the like.

As used herein, ranges and amounts can be expressed as "about" a particular value or range. "About" is intended to also include the exact amount. Hence "about 5 percent" means "about 5 percent" and also "5 percent." "About" means within typical experimental error for the application or purpose intended.

Throughout this disclosure, all parts and percentages are by weight (wt % or mass % based on the total weight) and all temperatures are in ° C. unless otherwise indicated.

PAI System Ink and Coating Compositions

The present invention provides hybrid thermal and energy curing photoimageable PAI compositions. The PAI compositions comprise one or more polyamideimide resins, one or more nitrogen containing ethylenically unsaturated monomers, and one or more aprotic solvents.

The one or more polyamideimide resins are generally present in an amount of about 2 wt % to about 35 wt %, based on the total weight of the ink or coating composition. For example, the one or more polyamideimide resins may be present in an amount of about 2 wt % to about 30 wt %; or about 2 wt % to about 20 wt %; or about 2 wt % to about 15 wt %; or about 5 wt % to about 35 wt %; or about 5 wt % to about 30 wt %; or about 5 wt % to about 25 wt %; or about 5 wt % to about 20 wt %; or about 5 wt % to about 15 wt %; or about 5 wt % to about 10 wt %.

The one or more nitrogen containing ethylenically unsaturated monomers are generally present in an amount of about 5 wt % to about 70 wt %, based on the total weight of the ink or coating composition. For example, the one or more nitrogen containing ethylenically unsaturated monomers may be present in an amount of about 5 wt % to about 65 wt %; or about 5 wt % to about 60 wt %; or about 5 wt % to about 55 wt %; or about 5 wt % to about 50 wt %; or about 5 wt % to about 40 wt %; or about 5 wt % to about 30 wt %; or about 5 wt % to about 20 wt %; or about 5 wt % to about 10 wt %. The one or more nitrogen containing ethylenically unsaturated monomers may be present in an amount of about 10 wt % to about 65 wt %; or about 10 wt % to about 60 wt %; or about 10 wt % to about 55 wt %; or about 10 wt % to about 50 wt %; or about 10 wt % to about 40 wt %; or about 10 wt % to about 30 wt %; or about 10 wt % to about 25 wt %; or about 10 wt % to about 20 wt %.

The one or more nitrogen containing ethylenically unsaturated monomers include, but are not limited to, amide compounds, such as, but not limited to, vinyl amides, and the like. Suitable examples of nitrogen containing ethylenically unsaturated monomers include, but are not limited to, N-vinylcaprolactam (NVC), N-vinyl pyrollidone (NVP), diacetone acrylamide, N-vinyl oxazolidinone or N-vinyl methoxazolidinone, N-vinyl carbazole, N-acryloxyoxyethylcyclohexanedicarboximide, N-vinyl imidazole, N-vinyl-N-methylacetamide (VIMA), acryloyl morpholine (ACMO), combinations thereof, and the like.

The one or more aprotic solvents are generally present in an amount of about 5 wt % to about 60 wt %, based on the total weight of the ink or coating composition. For example, the one or more aprotic solvents may be present in an amount of about 5 wt % to about 55 wt %; or about 5 wt % to about 50 wt %; or about 5 wt % to about 45 wt %; or about 5 wt % to about 40 wt %; or about 5 wt % to about 30 wt %; or about 5 wt % to about 25 wt %; or about 5 wt % to about 20 wt %; or about 5 wt % to about 15 wt %; or about 5 wt % to about 10 wt %. For example, the one or more aprotic solvents may be present in an amount of about 10 wt % to about 50 wt %; or about 10 wt % to about 45 wt %; or about 10 wt % to about 40 wt %.

Suitable aprotic solvents include, but are not limited to, N-ethylpyrrolidone, N-methyl-2-pyrrolidone, gamma-butyrolactone, N-acetylmorpholine, tetrahydrofuran, pyridine, nitromethane, dimethylformamide, acetonitrile, sulfolane, dimethyl sulfoxide or propylene carbonate, combinations thereof, and the like.

The compositions of the present invention may further comprise one or more amino acrylates. Amino acrylates are further examples of nitrogen contain ethylenically unsaturated monomers. Amino acrylates may also be included in addition to the nitrogen containing ethylenically unsaturated monomers described above. The one or more amino acrylates may be present in an amount of 0.01 wt % to 50 wt %, based on the total weight of the ink or coating composition. For example, the one or more amino acrylates may be present in an amount of about 0.5 wt % to about 50 wt %; or about 0.5 wt % to about 40 wt %; or about 0.5 wt % to about 30 wt %; or about 0.5 wt % to about 20 wt %; or about 0.5 wt % to about 10 wt %; or about 0.5 wt % to about 5 wt %. The one or more amino acrylates may be present in an amount of about 1 wt % to about 50 wt %; or about 1 wt % to about 45 wt %; or about 10 wt % to about 40 wt %.

Suitable amino acrylates include, but are not limited to: Ebecryl 80, Ebecryl 81, Ebecryl 83, Ebecryl 85, Ebecryl 841, Ebecryl LEO 10551, Ebecryl LEO 10552, Ebecryl LEO 10553, Ebecryl 7100, and Ebercryl P116 from Allnex; CN501, CN503, CN550, CN UVA421, CN341, CN3705, CN3715, CN3735, CN3755, CN381, CN386, CN384, CN584, and CN554 from Sartomer; Genomer 5142, Genomer 5161, and Genomer 5275 from Rahn; Photomer 4771, Photomer 4779F, Photomer 4967F, Photomer 4968F, Photomer 5006F, Photomer 4775F, and Photomer 5960F from IGM Resins; Laromer LR 8996, Laromer PO 94F, Laromer LR 8997, Laromer PO 9106, Laromer PO 9104, Laromer PO 9103, Laromer PO 83F, Laromer PO 84F, Laromer LR 8869, Laromer LR 8889, and Laromer PO 77F from BASF; Omnirad CI-250 and Omnilane A1230C from IGM Resins; or any other amino acrylate, combinations thereof, and the like.

The ink and coating compositions of the invention may further comprise one or more non-nitrogen containing ethylenically unsaturated monomers, including, but not limited to, (meth) acrylate or vinyl monomers, epoxy acrylates, combinations thereof, and the like. The non-nitrogen containing ethylenically unsaturated monomers may be present in an amount of about 0.01 wt % to about 40 wt %, based on the total weight of the ink or coating composition. For example, the one or more non-nitrogen containing ethylenically unsaturated monomers may be present in an amount of about 0.5 wt % to about 40 wt %; or about 0.5 wt % to about 35 wt %; or about 0.5 wt % to about 30 wt %; or about 0.5 wt % to about 20 wt %; or about 0.5 wt % to about 10 wt %; or about 0.5 wt % to about 5 wt %. The one or more non-nitrogen containing ethylenically unsaturated monomers may be present in an amount of about 1 wt % to about 40 wt %; or about 1 wt % to about 35 wt %; or about 1 wt % to about 30 wt %; or about 1 wt % to about 20 wt %; or about 1 wt % to about 15 wt %; or about 1 wt % to about 10 wt %; or about 1 wt % to about 5 wt %; or about 5 wt % to about 40 wt %; or about 5 wt % to about 30 wt %; or about 5 wt % to about 20 wt %; or about 5 wt % to about 10 wt %.

The compositions of the invention may further comprise one or more epoxy acrylates. The one or more epoxy acrylates may be present in an amount of about 0.01 wt % to about 35 wt %, based on the total weight of the ink or coating composition. For example, the one or more epoxy acrylates may be present in an amount of about 0.5 wt % to about 35 wt %; or about 0.5 wt % to about 30 wt %; or about 0.5 wt % to about 20 wt %; or about 0.5 wt % to about 10 wt %; or about 0.5 wt % to about 5 wt %; or about 1 wt % to about 35 wt %; or about 1 wt % to about 30 wt %; or about 1 wt % to about 20 wt %; or about 1 wt % to about 10 wt %; or about 1 wt % to about 5 wt %.

Suitable epoxy acrylates include, but are not limited to: CNUVE150/80, UVE151M, CN104, CN116, CN122A80, CN127, CN131B, CN132, CN152, CN164, CN186, CN109, CN110, CN111, CN112C60, CN113D70, and CN2003EU from Arkema; Photomer 3005, 3015 3016, and 3316 from IGM Resins; Diclite UE9010, 9240, 8710, and 8600 from DIC; SE120, 140, 145, 146, 147, 148, 1500, 1605, 1636, 1656, 1700, 1701, 1702, and 1703 from Soltech Ltd. UV-660; or 770 from Jainco Industry Chemicals.

The inks and coatings of the present invention may further comprise one or more photoinitiators. Suitable photoinitiators include, but are not limited to α-hydroxyketones, acylphosphine oxides, α-aminoketones, thioxanthones, benzophenones, phenyl glyoxylates, oxime esters, acetophenones, benzil compounds and derivatives thereof, fluorenones, anthraquinones, combinations thereof, and the like.

The one or more photoinitiators may be present in an amount of about 0.01 wt % to about 10 wt %, based on the total weight of the ink or coating composition. For example, the one or more photoinitiators may be present in an amount of about 0.01 wt % to about 5 wt %; or about 0.01 wt % to about 2 wt %; or about 0.01 wt % to about 1 wt %; or about 0.05 wt % to about 10 wt %; or about 0.05 wt % to about 5 wt %; or about 0.05 wt % to about 2 wt %; or 0.05 wt % to about 1 wt %; or about 0.5 wt % to about 10 wt %; or about 0.5 wt % to about 5 wt %; or about 0.5 wt % to about 2 wt %; or about 0.5 wt % to about 1 wt %; or about 1 wt % to about 10 wt %; or about 1 wt % to about 5 wt %; or about 1 wt % to about 4 wt %; or about 1 wt % to about 2 wt %.

Suitable α-hydroxyketone photoinitiators include, but are not limited to: 1-hydroxy-cyclohexyl-phenyl-ketone; 2-hydroxy-2-methyl-1-phenyl-1-propanone; 2-hydroxy-2-methyl-4'-tert-butyl-propiophenone; 2-hydroxy-4'-(2-hydroxyethoxy)-2-methyl-propiophenone; 2-hydroxy-4'-(2-hydroxypropoxy)-2-methyl-propiophenone; oligo 2-hydroxy-2-methyl-1-[4-(1-methyl-vinyl)phenyl]propanone; bis[4-(2-hydroxy-2-methylpropionyl)phenyl]methane; 2-Hydroxy-1-[1-[4-(2-hydroxy-2-methylpropanoyl) phenyl]-1,3,3-trimethylindan-5-yl]-2-methylpropan-1-one and 2-Hydroxy-1-[4-[4-(2-hydroxy-2-methylpropanoyl) phenoxy]phenyl]-2-methylpropan-1-one; combinations thereof; and the like.

Suitable acylphosphine oxide photoinitiators include, but are not limited to: 2,4,6-trimethylbenzoyl-diphenylphosphine oxide; ethyl (2,4,6-trimethylbenzoyl)phenyl phosphinate; and bis-(2,4,6-trimethylbenzoyl)-phenylphosphine oxide; combinations thereof; and the like.

Suitable α-aminoketone photoinitiators include, but are not limited to: 2-methyl-1-[4-methylthio)phenyl]-2-morpholinopropan-1-one; 2-benzyl-2-dimethylamino-1-(4-morpholinophenyl)-butan-1-one; and 2-dimethylamino-2-(4-methyl-benzyl)-1-(4-morpholin-4-yl-phenyl)-butan-1-one; combinations thereof; and the like.

Suitable thioxanthone photoinitiators include, but are not limited to: 2-4-diethylthioxanthone, isopropylthioxanthone, 2-chlorothioxanthone, and 1-chloro-4-propoxythioxanthone; combinations thereof; and the like.

Suitable benzophenone photoinitiators include, but are not limited to: benzophenone, 4-phenylbenzophenone, and 4-methylbenzophenone; methyl-2-benzoylbenzoate; 4-benzoyl-4-methyldiphenyl sulphide; 4-hydroxybenzophenone; 2,4,6-trimethyl benzophenone, 4,4-bis(diethylamino)benzophenone; benzophenone-2-carboxy(tetraethoxy)acrylate; 4-hydroxybenzophenone laurate and 1-[-4-[benzoylphenyl-sulpho]phenyl]-2-methyl-2-(4-methylphenylsulphonyl)propan-1-one; combinations thereof; and the like.

Suitable phenylglyoxylate photoinitiators include, but are not limited to: phenyl glyoxylic acid methyl ester; oxyphenyl-acetic acid 2-[hydroxyl-ethoxy]-ethyl ester, or oxyphenyl-acetic acid 2-[2-oxo-2-phenyl-acetoxy-ethoxy]-ethyl ester; combinations thereof, and like.

Suitable oxime ester photoinitiators include, but are not limited to: 1-phenyl-1,2-propanedione-2-(O-ethoxycarbonyl)oxime; [1-(4-phenylsulfanylbenzoyl)heptylideneamino] benzoate, or [1-[9-ethyl-6-(2-methylbenzoyl)carbazol-3-yl]-ethylideneamino]acetate; combinations thereof; and the like.

Examples of other suitable photoinitiators include diethoxy acetophenone; benzil; benzil dimethyl ketal; titanocen radical initiators such as titanium-bis(η 5-2,4-cyclopentadien-1-yl)-bis-[2,6-difluoro-3-(1H-pyrrol-1-yl) phenyl]; 9-fluorenone; camphorquinone; 2-ethyl anthraquinone; combinations thereof; and the like.

Polymeric photoinitiators and sensitisers are also suitable, including, for example: polymeric aminobenzoates (GENOPOL AB-1 or AB-2 from RAHN, Omnipol ASA from IGM or Speedcure 7040 from Lambson); polymeric benzophenone derivatives (GENOPOL BP-1 or BP-2 from RAHN, Omnipol BP, Omnipol BP2702 or Omnipol 682 from IGM or Speedcure 7005 from Lambson); polymeric thioxanthone derivatives (GENOPOL TX-1 or TX-2 from RAHN, Omnipol TX from IGM or Speedcure 7010 from Lambson); polymeric aminoalkylphenones such as Omnipol 910 from IGM; polymeric benzoyl formate esters such as Omnipol 2712 from IGM; and the polymeric sensitiser Omnipol SZ from IGM.

The inks and coatings of the invention may further comprise one or more colorants. Colorants include, but are not limited to, organic and inorganic pigments, and dyes. Dyes include, but are not limited to, azo dyes, anthraquinone dyes, xanthene dyes, azine dyes, combinations thereof and the like. Organic pigments may be one pigment or a combination of pigments, such as for instance Pigment Yellow Numbers 12, 13, 14, 17, 74, 83, 114, 126, 127, 174, 188; Pigment Red Numbers 2, 22, 23, 48:1, 48:2, 52, 52:1, 53, 57:1, 112, 122, 166, 170, 184, 202, 266, 269; Pigment Orange Numbers 5, 16, 34, 36; Pigment Blue Numbers 15, 15:3, 15:4; Pigment Violet Numbers 3, 23, 27; and/or Pigment Green Number 7. Inorganic pigments may be one of the following non-limiting pigments: iron oxides, titanium dioxides, chromium oxides, ferric ammonium ferrocyanides, ferric oxide blacks, Pigment Black Number 7 and/or Pigment White Numbers 6 and 7; combinations thereof; and the like. Other organic and inorganic pigments and dyes can also be employed, as well as combinations that achieve the colors desired.

The colorants may be present in an amount of about 0.01 wt % to about 10 wt %, based on the total weight of the ink or coating composition. For example, the one or more colorants may be present in an amount of about 0.01 wt % to about 7 wt %; or about 0.01 wt % to about 5 wt %; or about 0.01 wt % to about 4 wt %; or about 0.01 wt % to about 3 wt %; or about 0.01 wt % to about 2 wt %; or about 0.01 wt % to about 1 wt %; or about 0.1 wt % to about 5 wt %; or about 0.1 wt % to about 4 wt %; or about 0.1 wt % to about 3 wt %; or about 0.1 wt % to about 2 wt %; or about 0.1 wt % to about 1 wt %; or about 0.5 wt % to about 10 wt %; or about 0.5 wt % to about 7 wt %; or about 0.5 wt % to about 5 wt %; or about 0.5 wt % to about 4 wt %; or about 0.5 wt % to about 3 wt %; or about 0.5 wt % to about 2 wt %; or about 0.5 wt % to about 1 wt %. For example, the colorant may be present in an ink or coating of the invention in an amount of about 2.5 wt %.

EXAMPLES

The following examples illustrate specific aspects of the present invention, and are not intended to limit the scope thereof in any respect, and should not be so construed.

Methods

Mixing of Samples

Samples (i.e. mixtures/combinations and inks) were mixed using a Dispermat V5 mixer and suitable head attachment. Each sample was mixed for a minimum of 5 minutes and at a temperature above room temperature.

Note that the aprotic solvent in the samples is provided in the PAI resin used, which is supplied in 65% NEP.

Viscosity

Viscosity of the samples was tested using cone and plate Anton Paar Physica MCR 101 at room temperature, 25 mm cone, and units of measurement as Pa·s. If the viscosity of a sample was too thin to measure with the Anton Paar Physica MCR 101, then viscosity was measured using a Brookfield DV-II+ Pro rotational viscometer, set at 50° C., at 30 RPM, or at the RPM as stated in the Tables for a particular sample, and units of measurement as cP. The viscosity measurements of these thin samples are marked with an "*." Samples/combinations marked "–" in the Tables were not compatible, could not have an initial viscosity reading taken, and were therefore discarded from further testing.

Compatibility

Compatibility of the PAI and nitrogen containing ethylenically unsaturated monomer, or the PAI, nitrogen containing ethylenically unsaturated monomer and acrylates, of the samples/combinations was examined visually. A compatible sample/combination was classed as a homogenous 1-phase system. Combinations/samples that showed 2 or more phases were classed as non-homogenous, and therefore not compatible.

Printing Photoimageable Inks

Each ink was screen printed onto 2 brushed copper (i.e Cu) panels through a 43 Tcm$^{-1}$ polyester mesh, laying down approximately a 10 μm film. All printed panels were racked horizontally and given a pre-dry time between 40 and 60 minutes at 80° C. in a pre-heated oven. All printed panels were left to cool to room temperature in a dark cupboard to minimize natural UV light exposure. In an alternative method, it would be possible to dry the panels without heat (or with lower heat), but this is viewed as less desirable due to the increased processing time that would be required.

After cooling, each panel was cured. Each panel was exposed to UV radiation using a conventional mercury collimated UV light source, at 1000 mJ/cm$^2$, through a standard LPISM phototool, and developed with N-ethylpyrrolidone (NEP) solvent. Individually, the panels were wiped over with NEP to remove any uncured ink, and expose the image. To remove any excess NEP, the panels were wiped over with a clean cloth, rinsed with water, and then dried.

All panels were given a post bake of 1 hour at 150° C. in a pre-heated oven.

Adhesion

The adhesion of the inks as solder resists was tested according to the protocol described by IPC-TM-650 2.4.28 (Adhesion, Solder Mask (Non-Melting Metals)).

The printed panels were scored in an X-hatch (lattice) pattern. Pressure sensitive self-adhesive tape was firmly applied to the X-hatched surface, and pulled away at an angle approximately perpendicular to the printed surface. The printed surface was then examined for ink removal, and rated on a scale of 0 to 5, as described below.

0=edges of lattice completely smooth; no squares of lattice detached.
    1=small flakes of film/ink detached; no more than 5% of lattice affected.

2=film/ink flaked along edges and/or within squares with between 5 to 15% of the lattice affected.

3=film flaked along edges and/or large ribbons of film detached around squares with between 15 to 35% of the lattice affected.

4=film flaked along edges and/or whole or part of squares detached with between 35 to 65% of the lattice affected.

5=any degree of flaking that is classified to affect greater than 65% of the lattice.

Adhesion was tested both before and after soldering, according to IPC-TM-650 2.4.14.1 (Solderability, Wave Solder Method). In addition to the procedure steps described, after wave solder, each panel was submerged in water to cool.

Example 1. Compatibility of PAI with Nitrogen Containing Molecules

The compatibility of PAI with various nitrogen containing molecules was tested. Different ratios of nitrogen containing molecule to PAI were tested. Table 1 shows the stability of these combinations over 1 week.

enous 1-phase system. Combinations that showed 2 or more phases were classed as non-homogenous, and therefore not compatible. Viscosity was measured as described above.

Initial viscosity readings in Table 1 indicate the compatibility of each amino acrylate and ethylenically unsaturated monomer with PAI. The additional readings at 48 hours and 168 hours monitor the stability of each mixture. Overall, it is shown that PAI is compatible with all nitrogen containing materials tested, albeit to varying degrees of stability and ratio limits. The ethylenically unsaturated monomers show the best compatibility and stability across all viscosity results. ACMO, NVC, and DAAM, were further used to investigate the creation of PAI LPISM.

Example 2. Inks Containing PAI Resin and a Nitrogen-Containing Ethylenically Unsaturated Monomer Inks N1 to N7 were prepared according to the formulations in Table 2 below. The inks were mixed, and tested for compatibility of the PAI and nitrogen-containing ethylenically unsaturated monomer; or compatibility of the PAI,

TABLE 1

Compatibility of PAI with nitrogen containing molecules

| Nitrogen Compound (NC) | Ratio NC:PAI[6] | Recipe NC:PAI | Initial Viscosity (Pa · s. or cP) | Viscosity after 48 hr. (Pa · s. or cP) | Viscosity after 168 hr. (Pa · s. or cP) |
|---|---|---|---|---|---|
| Amino Acrylates | | | | | |
| Ebecryl Leo 10553[1] | 1:2 | 10 g:20 g | 2.43 | 2.50 | 2.50 |
| | 1:1 | 10 g:10 g | 2.41 | 2.31 | 2.30 |
| | 2:1 | 20 g:10 g | — | — | — |
| Ebecryl Leo 10552[2] | 1:2 | 10 g:20 g | 4.34 | 4.27 | 4.29 |
| | 1:1 | 10 g:10 g | 3.28 | 3.75 | 3.80 |
| | 2:1 | 20 g:10 g | — | — | — |
| CN3705[3] | 1:2 | 10 g:20 g | 5.00 | 4.90 | 4.70 |
| | 1:1 | 10 g:10 g | — | — | — |
| | 2:1 | 20 g:10 g | — | — | — |
| CN3715[4] | 1:2 | 10 g:20 g | 2.00 | 1.99 | 2.10 |
| | 1:1 | 10 g:10 g | — | — | — |
| | 2:1 | 20 g:10 g | — | — | — |
| Ebecryl P116[5] | 1:2 | 10 g:20 g | 1.59 | 1.12 | 1.70 |
| | 1:1 | 10 g:10 g | — | — | — |
| | 2:1 | 20 g:10 g | — | — | — |
| Nitrogen Containing Ethylenically Unsaturated Monomers | | | | | |
| Acryloyl morpholine (ACMO)[7] | 1:2 | 10 g:20 g | 1.00 | 1.12 | 1.10 |
| | 1:1 | 10 g:10 g | 0.26 | 0.38 | 0.38 |
| | 2:1 | 20 g:10 g | *51.5 (30 RPM) | *50.5 (30 RPM) | *50.5 (30 RPM) |
| N-Vinyl Capralactam (NVC)[8] | 1:2 | 10 g:20 g | *289.1 (5 RPM) | *350 (5 RPM) | — |
| | 1:1 | 10 g:10 g | *104.5 (12 RPM) | *140.0 (12 RMP) | — |
| | 2:1 | 20 g:10 g | *36.5 (50 RPM) | *51.3 (50 RPM) | — |
| Diacetone Acrylamide (DAAM)[9] | 1:2 | 10 g:20 g | 4.20 | 4.50 | 4.30 |
| | 1:1 | 10 g:10 g | 2.60 | 3.00 | 2.80 |
| | 2:1 | 20 g:10 g | 4.70 | 4.70 | 5.00 |

[1]Ebecryl Leo10553 Amino acrylate ex Allnex
[2]Ebecryl Leo 10552 Amino acrylate ex Allnex
[3]CN3705 Amino Acrylate ex Arkema
[4]CN3715 Amino Acrylate ex Arkema
[5]Ebecryl P116 Amino acrylate ex Allnex
[6]SR3604-35 Polyamideimide(PAI) ex FujiFilm
[7]Acryloyl Morpholine(ACMO) ex Rahn
[8]N-vinylcaprolactam(NVC) ex BASF
[9]Diacetoneacrylamide(DAAM) ex DSM Compatibility of the above combinations was examined visually. A compatible combination was classed as a homognitrogen containing ethylenically unsaturated monomer and (meth)acrylate, as described above.

TABLE 2

| Material | N1 | N2 | N3 | N4 | N5 | N6 | N7 |
|---|---|---|---|---|---|---|---|
| Inks N1 to N7 | | | | | | | |
| PolyAmideImide Resin (PAI) SR3604-35 | 40 | 33.4 | 25 | 33.4 | 40 | 25 | 33.4 |
| Acryloyl morpholine (ACMO) | 20 | 33.3 | 50 | 33.3 | 20 | 50 | 33.3 |
| Hydroxyethyl Methacrylate (HEMA)[10] | | | | | 40 | 25 | 33.3 |
| Trimethyl Olpropane Triacrylate (TMPTA)[11] | | | | | | | |
| Hexanediol Diacrylate (HDDA)[12] | | | | | | | |
| Epoxy Novolac Acrylate Resin (Diclite UE-8710)[13] | 40 | 33.3 | 25 | | | | |
| Dipentaerythritol Hexaacrylate (Etermer 265)[14] | | | | 33.3 | | | |
| Total | 100 | 100 | 100 | 100 | 100 | 100 | 100 |
| Compatibility | @ | @ | @ | @ | @ | @ | @ |
| Viscosity Initial Pa · s. or cP | 3.20 | 1.20 | 0.50 | 0.70 | *64.00 | *43.50 | *22.50 |
| Viscosity 48 Hrs. Pa · s. or cP | 2.40 | 1.30 | 0.45 | 0.70 | *63.00 | *40.70 | *23.40 |
| Viscosity 168 Hrs. Pa · s. or cP | 2.20 | 1.25 | 0.45 | 0.70 | *59.30 | *45.80 | *21.30 |

@ = compatible
[10] Hydroxyethylmethacrylate ex BASF
[11] Trimethylolpropane Triacrylate ex Arkema
[12] Hexanediol Diacrylate ex Arkema
[13] Epoxy Novolac Acrylate Diclite UE-8710 ex DIC
[14] DPHA Etermer 265 ex Eternal The results in Table 2 show that the PAI resin and the nitrogen containing compound (ACMO) in the inks are compatible, producing stable inks. Moreover, by including a nitrogen containing compound in the composition, the PAI and acrylates in the ink are rendered compatible.

Example 3. Inks C1 to C12 Containing PAI and Acrylates, but No Nitrogen Containing Ethylenically Unsaturated Monomer Comparative inks C1 to C12 were prepared as described above, and according to the formulations in Table 3. The comparative inks contain acrylates, but no nitrogen containing ethylenically unsaturated monomer.

Comparative inks C1 to C12 were examined for compatibility as described above. All comparative inks showed 2 or more phases and were not homogenous. Therefore, the PAI and acrylates in the comparatives inks were not compatible.

All comparative inks, C1 to C12, showed that, when the composition does not include a nitrogen containing ethylenically unsaturated monomer, PAI and UV curable materials are incompatible.

Conversely, inks N1 to N4 of the present invention, comprising a nitrogen containing ethylenically unsaturated monomer, were compatible. Thus, it is demonstrated that inclusion of a nitrogen containing ethylenically unsaturated monomer in the composition enables the PAI and UV curable material (i.e. acrylates) compatible and stable.

TABLE 3

| Material | C1 | C2 | C3 | C4 | C5 | C6 | C7 | C8 | C9 | C10 | C11 | C12 |
|---|---|---|---|---|---|---|---|---|---|---|---|---|
| Inks C1 to C12 | | | | | | | | | | | | |
| PAI resin SR3604-35 | 40 | 33.3 | 25 | 33.3 | 40 | 33.4 | 25 | 33.4 | 40 | 33.3 | 25 | 33.3 |
| ACMO | | | | | | | | | | | | |
| HEMA | 20 | 33.3 | 50 | 33.3 | | | | | | | | |
| TMPTA | | | | | 20 | 33.3 | 50 | 33.3 | | | | |
| HDDA | | | | | | | | | 20 | 33.3 | 50 | 33.3 |
| Diclite UE-8710 | 40 | 33.3 | 25 | | 40 | 33.3 | 25 | | 40 | 33.3 | 25 | |
| Etermer 265 | | | | 33.3 | | | | 33.3 | | | | 33.3 |
| Total | 100 | 100 | 100 | 100 | 100 | 100 | 100 | 100 | 100 | 100 | 100 | 100 |
| Compatibility | X | X | X | X | X | X | X | X | X | X | X | X |

X = incompatible

Example 4. Photoimageable Inks P1 to P18 Comprising PAI and a Nitrogen Containing Ethylenically Unsaturated Monomer Photoimageable inks P1 to P18 were prepared according to the formulations in Tables 4 to 6. Viscosities were measured as described above.

TABLE 4

Photoimageable inks P1 to P6

| Ingredient | P1 | P2 | P3 | P4 | P5 | P6 |
|---|---|---|---|---|---|---|
| PAI SR3604-35 | 40 | 33.4 | 25 | 40 | 33.4 | 25 |
| ACMO | 20 | 33.3 | 50 | 20 | 33.3 | 50 |
| NVC | | | | | | |
| Ebecryl Leo 10553[2] | | | | | | |
| DAAM | | | | | | |
| Diclite UE-8710 | 30 | 23.3 | 15 | | | |
| Etermer 265 | | | | 30 | 23.3 | 15 |
| HEMA | | | | | | |
| Ethoxylated Trimethyl Olpropane Triacrylate (E-TMPTA) | | | | | | |
| TPO[15] | 4 | 4 | 4 | 4 | 4 | 4 |
| ITX[16] | 1 | 1 | 1 | 1 | 1 | 1 |
| FOAMBLAST UVD[17] | 1 | 1 | 1 | 1 | 1 | 1 |
| †L2748 GREEN CONC[18] | 2.5 | 2.5 | 2.5 | 2.5 | 2.5 | 2.5 |
| Aerosil R972[19] | 1.5 | 1.5 | 1.5 | 1.5 | 1.5 | 1.5 |
| Total | 100.0 | 100.0 | 100.0 | 100.0 | 100.0 | 100.0 |
| Viscosity Pa·s. or cP | 4.40 | 1.40 | *243 (10 RPM) | 2.30 | 1.35 | 0.60 |

[15] 2,4,6-Trimethylbenzoylphenylphosphine Oxide ex IGM
[16] Isopropyl thioxanthone ex IGM
[17] Foamblast UVD ex Tennants
[18] Green concentrate ex SunChemical
[19] Aerosil R972 ex Evonik

TABLE 5

Photoimageable inks P7 to P12

| Material | Ink7 | Ink8 | Ink9 | Ink10 | Ink11 | Ink12 |
|---|---|---|---|---|---|---|
| PAI SR3604-35 | 40 | 33.4 | 25 | 20 | 71.4 | 45 |
| ACMO | 20 | 33.3 | 50 | 60 | 10 | 35 |
| NVC | | | | | | |
| Ebecryl Leo 10553 | | | | | | 10 |
| DAAM | | | | | | |
| Diclite UE-8710 | | | | | | |
| Etermer 265 | | | | 10 | 8.6 | |
| HEMA | | | | | | |
| E-TMPTA | 30 | 23.3 | 15 | | | |
| TPO | 4 | 4 | 4 | 4 | 4 | 4 |
| ITX | 1 | 1 | 1 | 1 | 1 | 1 |
| FOAMBLAST UVD | 1 | 1 | 1 | 1 | 1 | 1 |
| L2748 GREEN CONC | 2.5 | 2.5 | 2.5 | 2.5 | 2.5 | 2.5 |
| Aerosil R972 | 1.5 | 1.5 | 1.5 | 1.5 | 1.5 | 1.5 |
| Total | 100.0 | 100.0 | 100.0 | 100.0 | 100.0 | 100.0 |
| Viscosity Pa·s. or cP | 1.00 | *355 (6 RPM) | *202.5 (6 RPM) | 0.305 | 6.40 | 1.20 |

TABLE 6

Photoimageable inks P13 to P18

| Material | P13 | P14 | P15 | P16 | P17 | P18 |
|---|---|---|---|---|---|---|
| PAI SR3604-35 | 40 | 20 | 40 | 33.4 | 30 | 30 |
| ACMO | 20 | 20 | | | 15 | 20 |
| NVC | | | 20 | 33.3 | | |
| Ebecryl Leo 10553 | 30 | 50 | | | | |
| DAAM | | | | | 15 | 10 |
| Diclite UE-8710 | | | | | | |

TABLE 6-continued

Photoimageable inks P13 to P18

| Material | P13 | P14 | P15 | P16 | P17 | P18 |
|---|---|---|---|---|---|---|
| Etermer 265 | | | | | 30 | 30 |
| HEMA | | | | | | |
| E-TMPTA | | | 30 | 23.3 | | |
| TPO | 4 | 4 | 4 | 4 | 4 | 4 |
| ITX | 1 | 1 | 1 | 1 | 1 | 1 |
| FOAMBLAST UVD | 1 | 1 | 1 | 1 | 1 | 1 |
| L2748 GREEN CONC | 2.5 | 2.5 | 2.5 | 2.5 | 2.5 | 2.5 |
| Aerosil R972 | 1.5 | 1.5 | 1.5 | 1.5 | 1.5 | 1.5 |
| Total | 100.0 | 100.0 | 100.0 | 100.0 | 100.0 | 100.0 |
| Viscosity Pa · s. | 2.90 | 0.520 | 0.800 | 0.395 | 1.10 | 1.20 |

Inks P1 to P18 were printed onto copper panels as described above, and adhesion was tested as described above. The results are presented in Table 7 below.

TABLE 7

Adhesion of inks photoimageable inks P1 to P18

| | Panel | Adhesion Pre Solder X-Hatch | Visual Examination of Developed Image Pre-Solder | Adhesion Post Solder X-Hatch | Visual Examination of Developed Image Post Solder |
|---|---|---|---|---|---|
| P1 | 1 | 0 | Smooth, dry film | 0 | No Blistering or Peel of |
|  | 2 | 0 | adhered to Cu panel | 0 | film |
| P2 | 1 | 0 | Smooth, dry film | 0 | No Blistering or Peel of |
|  | 2 | 0 | adhered to Cu panel | 1 | film |
| P3 | 1 | 0 | Smooth, dry film | 0 | No Blistering or Peel of |
|  | 2 | 0 | adhered to Cu panel | 1 | film |
| P4 | 1 | 0 | Smooth, dry film | 0 | No Blistering or Peel of |
|  | 2 | 0 | adhered to Cu panel | 0 | film |
| P5 | 1 | 0 | Smooth, dry film | 0 | No Blistering or Peel of |
|  | 2 | 0 | adhered to Cu panel | 0 | film |
| P6 | 1 | 0 | Smooth, dry film | 0 | No Blistering or Peel of |
|  | 2 | 0 | adhered to Cu panel | 0 | film |
| P7 | 1 | 0 | Smooth, dry film | 0 | No Blistering or Peel of |
|  | 2 | 0 | adhered to Cu panel | 0 | film |
| P8 | 1 | 0 | Smooth, dry film | 0 | No Blistering or Peel of |
|  | 2 | 0 | adhered to Cu panel | 0 | film |
| P9 | 1 | 0 | Smooth, dry film | 0 | No Blistering or Peel of |
|  | 2 | 0 | adhered to Cu panel | 0 | film |
| P10 | 1 | 0 | Smooth, dry film | 1 | No Blistering, Peel at |
|  | 2 | 0 | adhered to Cu panel | 0 | edges of film |
| P11 | 1 | 0 | Smooth, dry film | 0 | No Blistering or Peel of |
|  | 2 | 0 | adhered to Cu panel | 0 | film |
| P12 | 1 | 0 | Smooth, dry film | 1 | No Blistering, Peel at |
|  | 2 | 0 | adhered to Cu panel | 1 | edges of film |
| P13 | 1 | 0 | Smooth, dry film | 0 | No Blistering or Peel of |
|  | 2 | 0 | adhered to Cu panel | 0 | film |
| P14 | 1 | 0 | Smooth, dry film | 1 | No Blistering, Slight Peel |
|  | 2 | 0 | adhered to Cu panel | 1 | at edges of film |
| P15 | 1 | 0 | Smooth, dry film | 1 | No Blistering or Peel of |
|  | 2 | 0 | adhered to Cu panel | 0 | film |
| P16 | 1 | 0 | Smooth, dry film | 0 | No Blistering or Peel of |
|  | 2 | 0 | adhered to Cu panel | 0 | film |
| P17 | 1 | 0 | Smooth, dry film | 0 | No Blistering or Peel of |
|  | 2 | 0 | adhered to Cu panel | 0 | film |
| P18 | 1 | 0 | Smooth, dry film | 0 | No Blistering or Peel of |
|  | 2 | 0 | adhered to Cu panel | 0 | film |

The results of Table 7 show that the inks of the present invention can be photo-defined. Photo-defining is preferable to screen defining as greater resolution can be achieved.

The present examples show that the addition of nitrogen containing ethylenically unsaturated monomers, such as ACMO, NVC or DAAM, into the ink formulation enables the previously only screen definable PAI resin to be photo-defined. This alternative imaging technique broadens the resolution limits possible for PAI systems. Soldermasks are one example of a possible application of a photoimageable PAI system, and the PAI system must withstand soldering as a basic function. Cross hatch adhesion testing of P1 to P18 was done before and after wave solder to test whether the inks deteriorated upon contact with the solder. Examples P1 to P18 all passed the cross hatch test (IPC-TM-650 2.4.28) both pre- and post-solder wave, proving their potential to be applied in LPISM high temperature applications.

The present invention has been described in detail, including the preferred embodiments thereof. However, it will be appreciated that those skilled in the art, upon consideration of the present disclosure, may make modifications and/or improvements on this invention that fall with the scope and spirit of the invention.

The invention claimed is:

1. A hybrid thermal and energy curable ink or coating composition comprising:
   a.) one or more polyamideimide resins;
   b.) one or more nitrogen containing ethylenically unsaturated monomers having an ethylenically unsaturated group at a terminal end of the monomer; and
   c.) one or more aprotic solvents; wherein the amounts of a, b, and c are:
   2 wt % to 35 wt % of the one or more polyamideimide resins;
   5 wt % to 70 wt % of the one or more nitrogen containing ethylenically unsaturated monomers; and
   5 wt % to 60 wt % of the one or more aprotic solvents.

2. The ink or coating composition of claim 1, further comprising:
   a) one or more amino acrylates;
   b) one or epoxy acrylates; and
   c) one or more non-nitrogen containing ethylenically unsaturated monomers.

3. The ink or coating composition of claim 2, comprising:
   a) 0.01 wt % to 50 wt % one or more amino acrylates;
   b) 0.01 wt % to 35 wt % one or more epoxy acrylates; and
   c) 0.01 wt % to 40 wt % one or more non-nitrogen containing ethylenically unsaturated monomers.

4. The ink or coating composition of claim 1, further comprising one or more photoinitiators.

5. The ink or coating composition of claim 4, wherein the one or more photoinitiators are present in an amount of 0.01 wt % to 10 wt %.

6. The ink or coating composition of claim 1, wherein the one or more nitrogen containing ethylenically unsaturated monomers having an ethylenically unsaturated group at a terminal end of the monomer are each independently selected from the group consisting of vinyl amides, acryloyl morpholine, N-vinylcaprolactam, diacetone acrylamide, N-vinyl pyrolidone, N-vinyl oxazolidinone, N-vinyl methoxazolidinone, N-vinyl carbazole, N-acryloxyoxyethylcyclohexanedicarboximide, N-vinyl imidazole, N-vinyl-N-methylacetamide, and combinations thereof.

7. The ink or coating composition of claim 1, wherein at least one nitrogen containing ethylenically unsaturated monomer is acryloyl morpholine.

8. The ink or coating composition of claim 1, wherein the ink or coating composition is suitable for use in the fabrication of printed circuit boards.

9. The ink or coating composition of claim 1 wherein the ink or coating composition is suitable for use in the fabrication of photovoltaic modules and devices.

10. The ink or coating composition of claim 1, wherein the ink or coating composition is suitable for use in the fabrication of membrane switches and printed electronics.

11. A hybrid thermal and energy curable ink or coating composition comprising:
   a.) 2 wt % to 35 wt % one or more polyamideimide resins;
   b.) one or more nitrogen containing ethylenically unsaturated monomers having an ethylenically unsaturated group at a terminal end of the monomer;
   c.) 5 wt % to 60 wt % one or more aprotic solvents;
   d.) 0.01 wt % to 50 wt % one or more amino acrylates;
   e.) 0.01 wt % to 35 wt % one or more epoxy acrylates; and
   f.) 0.01 wt % to 40 wt % one or more non-nitrogen containing ethylenically unsaturated monomers; wherein the amount of b is:
   5 wt % to 70 wt % of the one or more nitrogen containing ethylenically unsaturated monomers.

12. An article comprising the ink or coating composition of claim 1.

13. The article of claim 12, wherein the article is a photovoltaic module, a photovoltaic device, membrane switch, or part of a printed electronic device.

14. The ink or coating composition of claim 11, wherein the one or more nitrogen containing ethylenically unsaturated monomers having an ethylenically unsaturated group at a terminal end of the monomer are each independently selected from the group consisting of vinyl amides, acryloyl morpholine, N-vinylcaprolactam, diacetone acrylamide, N-vinyl pyrolidone, N-vinyl oxazolidinone, N-vinyl methoxazolidinone, N-vinyl carbazole, N-acryloxyoxyethylcyclohexanedicarboximide, N-vinyl imidazole, N-vinyl-N-methylacetamide, and combinations thereof.

15. The ink or coating composition of claim 1, wherein the one or more nitrogen containing ethylenically unsaturated monomers having an ethylenically unsaturated group at a terminal end of the monomer are each independently selected from the group consisting of vinyl amides, N-vinylcaprolactam, diacetone acrylamide, N-vinyl pyrolidone, N-vinyl oxazolidinone, N-vinyl methoxazolidinone, N-vinyl carbazole, N-acryloxyoxyethylcyclohexanedicarboximide, N-vinyl imidazole, N-vinyl-N-methylacetamide, and combinations thereof.

16. The ink or coating composition of claim 11, wherein the one or more nitrogen containing ethylenically unsaturated monomers having an ethylenically unsaturated group at a terminal end of the monomer are each independently selected from the group consisting of vinyl amides, N-vinylcaprolactam, diacetone acrylamide, N-vinyl pyrolidone, N-vinyl oxazolidinone, N-vinyl methoxazolidinone, N-vinyl carbazole, N-acryloxyoxyethylcyclohexanedicarboximide, N-vinyl imidazole, N-vinyl-N-methylacetamide, and combinations thereof.

* * * * *